United States Patent [19]

Takahashi

[11] Patent Number: 5,644,212
[45] Date of Patent: Jul. 1, 1997

[54] TRACTION BATTERY MANAGEMENT SYSTEM

[75] Inventor: Tsutomu Takahashi, Oota, Japan

[73] Assignee: Fuji Jukogyo Kabushiki Kaisha, Tokyo, Japan

[21] Appl. No.: 552,080

[22] Filed: Nov. 2, 1995

[30] Foreign Application Priority Data

Nov. 11, 1994 [JP] Japan ..................... 6-278080

[51] Int. Cl.$^6$ ..................... H02J 7/00
[52] U.S. Cl. ............... 320/48; 320/43; 320/44
[58] Field of Search .................. 320/48, 43, 44, 320/17-18, 15, 5-6; 429/92; 324/425

[56] References Cited

U.S. PATENT DOCUMENTS

| | | | |
|---|---|---|---|
| 4,484,130 | 11/1984 | Lowndes et al. | 320/48 X |
| 4,558,281 | 12/1985 | Codd et al. | 320/48 X |
| 5,280,231 | 1/1994 | Kato et al. | 320/43 X |
| 5,479,085 | 12/1995 | Honda et al. | 320/48 |
| 5,568,052 | 10/1996 | Sway-Tin et al. | 320/48 X |
| 5,578,915 | 11/1996 | Crouch, Jr. et al. | 320/48 |
| 5,583,413 | 12/1996 | Proctor et al. | 320/48 X |

*Primary Examiner*—Peter S. Wong
*Assistant Examiner*—K. Shin
*Attorney, Agent, or Firm*—Beveridge, DeGrandi, Weilacher & Young, L.L.P.

[57] ABSTRACT

To equally charge a plurality of batteries constituting a traction battery, when the number of times of the ordinary charges increases beyond a reference value or when the sum total watt-hour (charged energy or charged and discharged energy) of the traction battery increases beyond a reference value or when a difference in terminal voltage between the maximum and minimum values among the battery blocks increases beyond a reference value, the traction battery is automatically equalizing charged at a small charge current for a long charge time, continuously after the ordinary battery charge, periodically, thus facilitating the maintenance of an electric vehicle. Further, whenever the traction battery is equalizing charged, the remaining battery capacity meter can be reset to a full scale automatically to eliminate an accumulated error. In addition, the battery life is estimated for battery replacement.

15 Claims, 8 Drawing Sheets

TRACTION BATTERY MANAGEMENT SYSTEM

BACKGROUND OF THE INVENTION

1. Field of the Invention

The present invention relates to a traction battery management system, and more specifically to a battery management system for an electric vehicle, provided with various functions such as a remaining battery capacity display function, charger control function and battery life estimating function, etc.

2. Description of the Prior Art

In an electric vehicle developed recently, it is important to detect various battery conditions accurately, in particular to obtain a remaining battery capacity accurately. Therefore, various techniques related thereto have been so far proposed.

For instance, Japanese Published Unexamined (Kokai) Patent Application No. 6-6901 discloses such a remaining battery capacity meter of current integrating type that a reference remaining battery capacity is obtained by subtracting a consumed watt-hour (energy) corrected according to various operating conditions from an initial battery capacity and further the obtained reference remaining battery capacity is corrected.

Further, Japanese Published Unexamined (Kokai) Patent Application No. 5-276603 discloses such a battery management technique that a remaining battery capacity meter of current integrating type is provided to obtain an accurate remaining battery capacity on the basis of charge and discharge current, and that the traction battery is controllably charged according to data indicative of detected discharged watt-hour, the number of times of charges, the motor drive data, etc. all stored in a memory.

In the conventional remaining battery capacity meter of current integrating type, however, since an error inevitably produced and further accumulated whenever the remaining battery capacity is obtained, there exists a problem in that the accumulated error must be corrected.

By the way, in the electric vehicles, since a relatively high voltage is required as a power source for driving the vehicle, the traction battery used as the primary power source is usually formed by a combination battery such that a plurality of module batteries each composed of a plurality of cells are combined with each other. In the case of a lead acid battery, for instance, a module battery of rated voltage 12 V ($\approx$2.1 V×6) is composed of six cells of 2.1 V, and a traction battery of rated voltage 336 V (=12 V×28) can be obtained by connecting 28 unit batteries in series. Therefore, the total number of the traction battery cells is as large as 168 (=6×28).

As a result, when a plurality of series-connected batteries are charged, in order to charge the combination battery uniformly (without producing any difference in charged capacity among the respective unit batteries or cells), it is necessary to charge the traction battery uniformly and periodically (at regular intervals).

In other words, the charged capacities of the respective battery units or cells are different from each other due to the difference in characteristics among the battery cells, when the traction battery is repeatedly charged in the ordinary way, there inevitably exist some battery cells not charged sufficiently. Therefore, in order to charge all the battery cells sufficiently (without producing any insufficiently charged cells or units), it is necessary to charge the traction battery at regular intervals at a constant lower current for a longer time than the current and time of the ordinary charge, which is referred to as equalizing charge for eliminating the insufficiently charged battery cells.

For instance, when the battery capacity C is 90 Ah and therefore the traction battery is charged by a current 0.1 C (=9 A) for a predetermined time under the ordinary charge condition, it is necessary to further charge the traction battery by a constant small current 0.05 C (=4.5 to 1 A) for two hours periodically, continuously after the ordinary battery charge.

On the other hand, when the traction battery is additionally charged by a constant small current, since the battery cells are overcharged partially, when the equalizing charge is effected excessively, there arises a problem in that the battery life is shortened.

Conventionally, therefore, the traction battery has been so far equalizing charged manually, in dependence upon the number of times of charges or the used time period, thus causing the maintenance of the electric vehicle to be complicated.

In addition, since the life of the traction battery mounted on an electric vehicle is also presumed by the worker on the basis of the number of times of chargings or the used time period, there exists a need of estimating the battery life easily or automatically on the basis of the various battery data.

SUMMARY OF THE INVENTION

With these problems in mind, therefore, it is the object of the present invention to provide a battery management system for an electric vehicle, which can facilitate the maintenance of the electric vehicle by automatizing the equalizing charging work of the traction battery.

Further, a second object of the present invention is to provide a battery management system for an electric vehicle, which can simply correct the error of a remaining battery capacity meter, while facilitating the maintenance of the electric vehicle by automatizing the equalizing charging work of the traction battery.

Further, a third object of the present invention is to provide a battery management system, which can easily estimate the life of the traction battery mounted on an electric vehicle.

To achieve the above-mentioned object, the present invention provides a traction battery management system, comprising: detecting means for detecting battery conditions of an electric vehicle composed of a plurality of batteries and mounted on the electric vehicle; calculating means for calculating battery charge and discharge conditions of the traction battery on the basis of the detected battery conditions; and means for equalizing charging the traction battery on the basis of the calculated battery charge and discharge conditions, in such charging characteristics that charge current is relatively smaller and charge time is relatively longer, as compared with those in an ordinary battery charge, continuously after the ordinary battery charge.

Here, the detected battery conditions are Current (A), terminal voltages (V) of the respective batteries, and duration time ($\Delta t$) during both battery charge and discharge of the traction battery. The calculated traction battery charge and discharge conditions are charge and discharge power ($P_1 = A \times V$), Charge and discharge Watt-hour ($P_2 = P_1 \times \Delta t$), sum total charge or discharge watt-hour ($P_{2S(n)} = \Sigma P_2$) during charge or discharge, sum total charge and discharge watt-hour ($P_{2ABS} = \Sigma P_{2AB}$) during both charge and discharge, difference in terminal voltage between maximum and minimum values ($V_{max}-V_{min}$) among the batteries, and the number of times of the ordinary charges ($N_c$) calculated by counting peaks of watt-hours ($P_2$) of charged traction battery.

Further, said equalizing charging means charges the traction battery when the number ($N_c$) of times of the ordinary charges becomes equal to or larger than a reference value ($N_{ref}$), after the preceding equalizing charge. Further, said equalizing charging means charges the traction battery when the sum total watt-hour ($P_{2ABS}=\Sigma P_{2AB}$) during both battery charges and discharges becomes equal to or larger than a reference watt-hour value ($\Sigma P_{2ABSC}$), after the preceding equalizing charge. Further, said equalizing charging means charges the traction battery when the sum total watt-hours ($P_{2S(n)}=\Sigma P_2$) during only battery charges becomes equal to or larger than a reference watt-hour value, after the preceding uniform-charge. Further, said equalizing charging means charges the traction battery when the difference ($V_{max}-V_{min}$) in terminal voltage between the maximum and minimum values among the respective batteries becomes equal to or larger than a reference value ($V_{ref}$).

Here, it is preferable that the traction battery management system further comprises: means for indicating remaining battery capacity in a ratio by subtracting discharged watt-hour from a full scale; and means for resetting the remaining battery capacity indicating means whenever the traction battery is charged by said equalizing charging means. Further, it is preferable that the traction battery management system further comprises battery life discriminating means, comprising: means for calculating a sum total watt-hour ($\Sigma P_2$) from when the traction battery is discharged to when a minimum terminal voltage among the respective batteries reaches a discharge end voltage; means storing the calculated sum total discharge watt-hour ($\Sigma P_2$) as data ($P_{j(n)}$) in a memory unit; means for comparing the stored current data ($P_{j(n)}$) with initial data ($P_{j(o)}$) calculated when the traction battery was new whenever the traction battery is equalizing charged; and means for generating an alarm when a difference ($P_{j(o)}-P_{j(n)}$) between the initial data ($P_{j(o)}$) and the current data ($P_{j(n)}$) is equal to or larger than a reference value ($P_{jref}$).

Further, the present invention provides a method of equalizing charging a traction battery composed of a plurality of batteries, comprising the steps of: detecting traction battery current (A); detecting traction battery voltage (V); calculating power ($P_1=A \times V$) of the traction battery; calculating watt-hour ($P_2=P_1 \times \Delta t$) of the traction battery; calculating a sum total watt-hour ($P_{2s(n)}=\Sigma P_2$) both during charge and discharge; calculating a difference ($\Delta P_{2S(n)}=P_{2S(n)}-P_{2s(n-1)}$) in watt-hour between the sum total value ($P_{2S(n-1)}$) to current sampling time and the sum total value ($P_{2S(n-1)}$) to preceding sampling time; checking whether the calculated difference ($\Delta P_{2S(n-1)}$) is zero or positive; if yes, checking whether the calculated difference ($\Delta P_{2S(n)}$) is negative; if yes, counting the number of times that the calculated difference changes from positive to negative as the number of peaks ($N_c$); comparing the counted number of peaks ($N_c$) with a reference value ($N_{ref}$); and if the counted number of peaks ($N_c$) is equal to or larger than the reference value ($N_c$), generating an equalizing charge command and clearing the counted peaks ($N_c$).

Further, the present invention provides a method of equalizing charging a traction battery composed of a plurality of batteries, comprising the steps of: detecting traction battery current (A); detecting traction battery voltage (V); calculating power ($P_1=A \times V$) of the traction battery; calculating watt-hour ($P_2=P_1 \times \Delta t$) of the traction battery; obtaining an absolute value of the calculated watt-hour ($P_{2AB}=|P_2|$); calculating a sum total absolute watt-hour ($P_{2ABS}=\Sigma P_{2AB}$) both during charge and discharge; comparing the calculated sum total absolute watt-hour ($P_{2ABS}$) with a reference value ($P_{2ABSC}$); and if the calculated sum total absolute watt-hour ($P_{2ABS}$) is equal to or larger than the reference value ($P_{2ABSC}$), generating a uniform-charge command and clearing the calculated sum total absolute watt-hour ($P_{2ABS}$).

Further, the present invention provides a method of equalizing charging a traction battery composed of a plurality of batteries, comprising the steps of: detecting traction battery current (A); detecting traction battery voltage (V); detecting a maximum terminal voltage ($V_{max}$) among the respective batteries constituting the traction battery; detecting a minimum terminal voltage ($V_{min}$) among the respective batteries; comparing a difference ($V_{max}-V_{min}$) in terminal voltage between the maximum and minimum values among the respective batteries with a reference value ($V_{ref}$); and if the difference ($V_{max}-V_{min}$) is equal to or larger than the reference value ($V_{ref}$), generating an equalizing charge command.

Further, it is preferable that the method further comprises a process of resetting a remaining battery capacity meter, having the steps of: checking whether the traction battery is connected to a battery charger; checking whether the equalizing charge command is being outputted; if no, reading an ordinary charge pattern from a map indicative of current, voltage and time; if yes, reading an equalizing charge pattern from a map indicative of current, voltage and time; correcting the read voltage, current and time on the basis of detected temperature and preceding discharge conditions; outputting the corrected charge voltage and charge current to the charger; checking whether the ordinary charge ends; if yes, checking whether the equalizing charge ends; and if yes, resetting the remaining battery capacity meter to a full scale.

Further, it is preferable that the method further comprises a battery life estimating processing, having the steps of: detecting traction battery current (A); detecting traction battery voltage (V); calculating power ($P_1=A \times V$) of the traction battery; calculating watt-hour ($P_2=P_1 \times \Delta t$) of the tractions battery; detecting a minimum terminal voltage ($V_{min}$) among the respective batteries constituting the traction battery; checking whether the detected minimum terminal voltage reaches a discharge end voltage; if yes, calculating a sum total watt-hour ($P_{2S(n)}=\Sigma P_2$) from when the battery is discharged to when the minimum terminal voltage among the respective batteries reaches the discharge end voltage; checking whether the equalizing charge ends; if ends, storing the calculated sum total watt-hour ($P_{2S(n)}=\Sigma P_2$) during discharge as data ($P_{j(n)}$) in a memory; comparing the stored current data ($P_{j(n)}$) with initial data ($P_{j(o)}$) when the traction battery was new; and generating an alarm when a difference ($P_{j(o)}-P_{j(n)}$) between the initial data ($P_{j(o)}$) and the current data ($P_{j(n)}$) is equal to or larger than a reference value ($P_{jref}$).

As described above, in the traction battery management system according to the present invention, since the equalizing charge command can be generated whenever the number. Of times of the ordinary charges increases beyond a reference value or whenever the such total watt-hour (charged energy or Charged and discharged energy) of the traction battery increases beyond a reference value or whenever a difference in block terminal voltage between the maximum and minimum values among the battery blocks increases beyond a reference value, it is possible to equalizing charge the high voltage battery automatically after the ordinary battery charge, with the result that the maintenance of the traction battery can be facilitated.

Further, since the remaining battery capacity meter section can be reset automatically whenever the traction battery has been equalizing charged, it is possible to eliminate an accumulated error of the remaining battery capacity meter.

Further, since the battery deterioration or battery life can be detected by comparing the initial discharged energy (when the traction battery is new) with the current discharged energy (when the traction battery is now equalizing charged), it is possible to detect the traction battery deterioration or the traction battery life automatically, for traction battery replacement.

DETAILED DESCRIPTION OF THE EMBODIMENTS

A preferred embodiment of the present invention will become understood from the following detailed description referring to the accompanying drawings.

Figure 1:
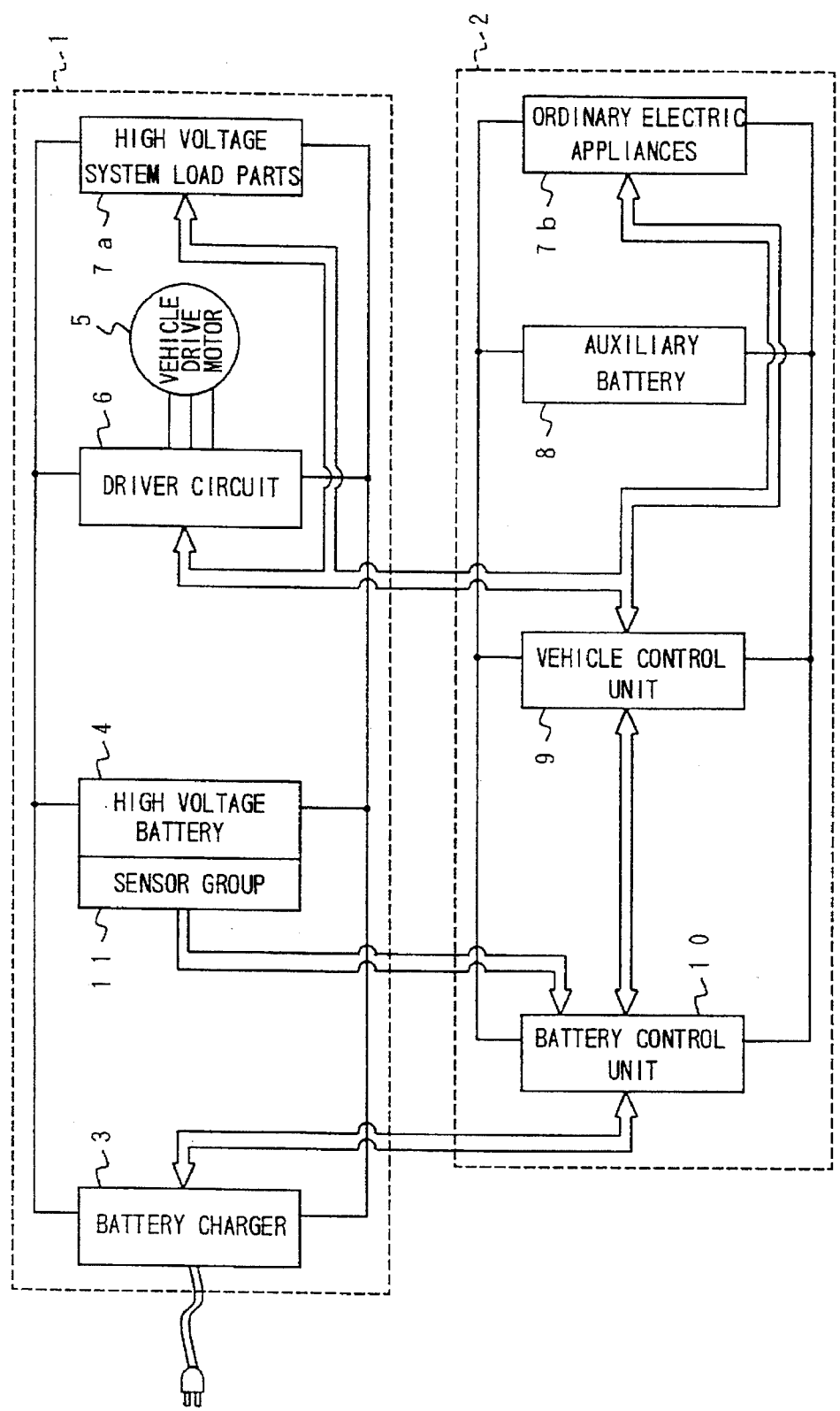
FIG. 1 is a block diagram showing a traction battery management system of an electric vehicle.

In FIG. 1, a fraction battery system of an electric vehicle is composed of a high voltage power source system 1 and a low voltage power source system 2. In the high voltage power source system 1, a high voltage battery 4 is connected to a vehicle drive motor 5 via a driver circuit (e.g., inverter) 6, and further directly to a high voltage electric load parts 7a (e.g., air conditioner, heater, etc).

The high voltage battery 4 is of lead acid battery (in this embodiment), in which 28 battery units each having rated voltage 12 V (each composed of six cells of 2.1 V) are connected in series to obtain a combination battery of nominal 336 V ($\approx$2.1 V$\times$6$\times$28). When the battery capacity decreases below a specified value, the combination battery must be charged by a battery charger 3 connected to an external power source (not shown).

Further, the vehicle drive motor 5 is of AC induction type, for instance, and a driving power of the vehicle drive motor 5 is transmitted to a vehicle driving system (a drive shaft, a differential gear, etc.) of an electric vehicle. Further, when the electric vehicle is traveling, the high voltage battery 4 can be charged by the regenerative power of the vehicle drive motor 5 through the driver circuit 6.

On the other hand, in the low voltage power source system 2, an auxiliary battery 8 (different from the high voltage battery 4) is connected to ordinary electric appliances 7b (e.g., wiper, radio, various display instruments, etc.), a vehicle control unit 9 for controlling an electric vehicle, and a battery management unit 10 for managing the high voltage battery 4.

The vehicle control unit 9 controls the vehicle drive and other controls required when the electric vehicle is traveling, on the basis of the commands of the driver. In more detail, the vehicle control unit 9 detects various vehicle operating conditions on the basis of the signals transmitted by the battery management unit 10 and various sensors and switches (not shown), and controls the vehicle drive motor 5 via the driver circuit 6 or turns on or off the high voltage system electric load parts 7a or displays various necessary data for the driver on or through the ordinary electric appliances (e.g., display units).

The battery management unit 10 executes various battery management operations such as the measurement of the remaining battery capacity of the high voltage battery 4, the estimation of the battery life, the control of equalizing charge of the battery, etc., on the basis of signals of a sensor group 11 (described later in further detail as battery condition detecting means) for detecting the terminal voltage of the high voltage battery 4, the charge or discharge current thereof, the temperature thereof, etc. In addition, the battery management unit 10 outputs control command signals and necessary measurement data to the charger 3 and the vehicle control unit 9, at needs.

The battery management system composed of the battery management unit 10 and other elements or units will be described in further detail hereinbelow with reference to FIG. 2.

The battery management unit 10 is composed of a microcomputer 12, an A/D converter 13 connected to the microcomputer 12, and various peripheral circuits (not shown). To the A/D converter 13, various elements are connected such as an amplifier 15 for amplifying a signal of a current sensor 14 (one of sensors for constituting the sensor group 11); respective amplifiers 23 to 29 for amplifying signals of temperature sensors 16 to 22 of the sensor group 11; and various amplifiers 30 to 36 for amplifying signals of various voltage sensors of the sensor group 11. That is, various analog signals indicative of the battery charge or discharge current, temperatures of the respective battery blocks (described later), and voltages of the respective battery blocks are converted from the analog signals to corresponding digital signals by the A/D converter 13, before inputted to the microcomputer 12.

Figure 2:
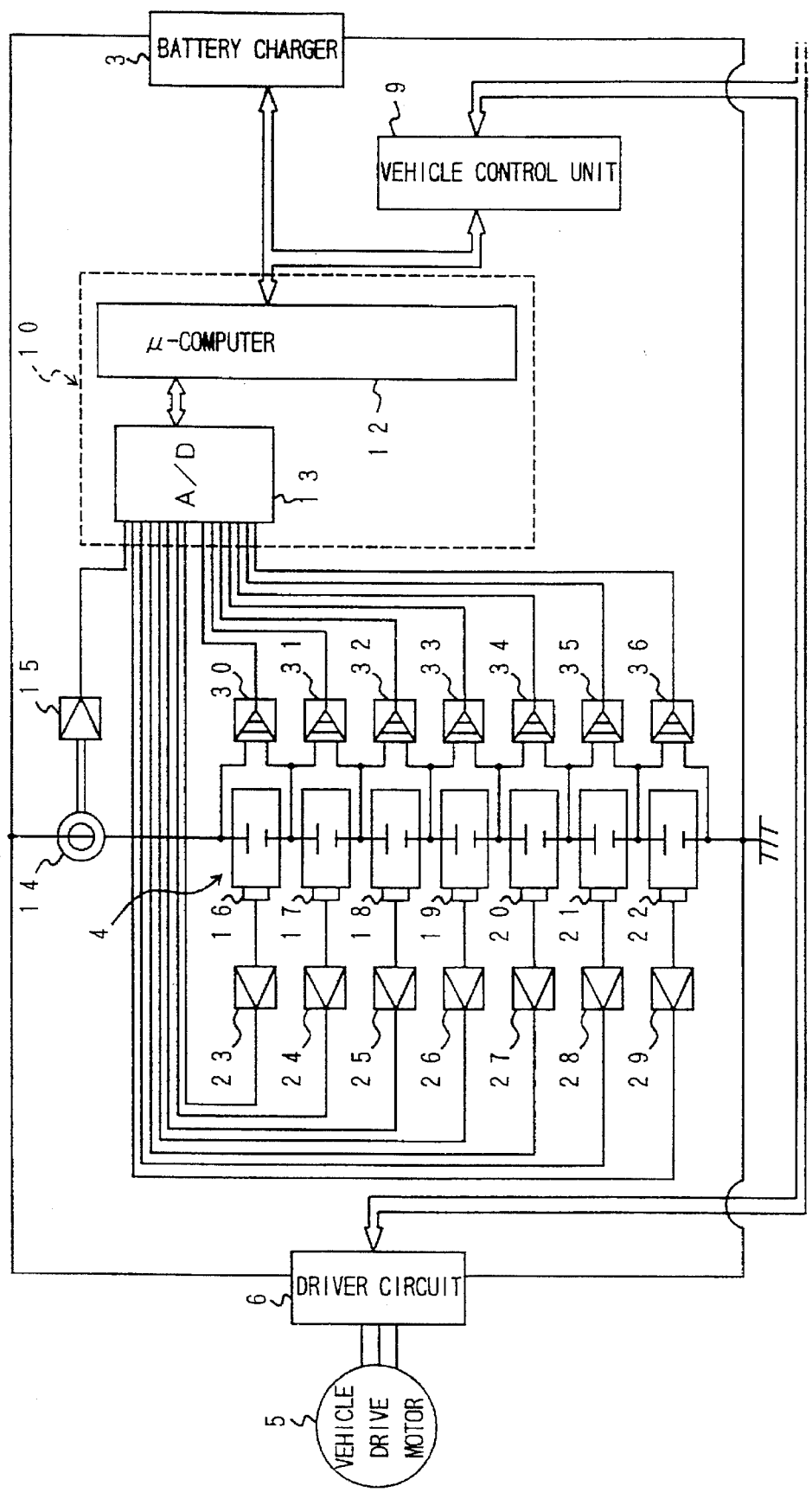
FIG. 2 is a block diagram showing a traction battery management unit and its associated elements or units of the electric vehicle.

Here, in this embodiment shown in FIG. 2, the high voltage battery 4 is formed by connecting 28 battery units each composed of six cells in series (i.e., 28$\times$6 cells=168 cells), as already explained. Further, the high voltage battery 4 is divided into seven blocks (168 cells /7=24 cells) each composed of four battery units (4$\times$6 cells=24 cells). Therefore, the battery voltage (2.1 V $\times$24 cells$\geq$48 V) is detected for each block.

The current sensor 14 is of hall element type. Being interconnected midway to a power line extending from a positive terminal of the high voltage battery 4, this current sensor 14 detects the charge or discharge current of the high voltage battery 4. Further, the current detected by the current sensor 14 is represented as [+] when charged but [−] when discharged by opposite signs.

Further, the above-mentioned seven temperature sensors 16 to 22 are of thermistor type, respectively, for instance. Each temperature sensor is connected to each block composed of four unit batteries of nominal 12 V connected in series, to detect each temperature for each block. Further, the seven amplifiers (voltage sensors) 30 to 36 are of differential amplifier type, respectively. Each differential amplifier detects each terminal voltage (nominal: 48 V) of each block.

The above-mentioned microcomputer 12 executes various battery control functions such as the equalizing charge command signal generating processing, the remaining battery capacity measurement processing, and the battery life estimation processing, all for the high voltage battery 4.

In the case of the equalizing charge command signal generating processing, the microcomputer 12 is provided with three different control sections (methods) for detecting the necessity of the equalizing charge of the high voltage battery 4. The three control sections are a first equalizing charge command generating section for outputting an equalizing charge command on the basis of the number of times of charges; a second equalizing charge command generating section for outputting an equalizing charge command on the basis of the watt-hour (energy) charged and discharged (or only discharged) to and from the high voltage battery 4; and a third equalizing charge command generating section for outputting an equalizing charge command on the basis of the difference in the terminal voltages among the battery blocks. Further, the high voltage battery 4 is charged whenever any one of these three equalizing charge command generating sections outputs an equalizing charge command.

Figure 3:
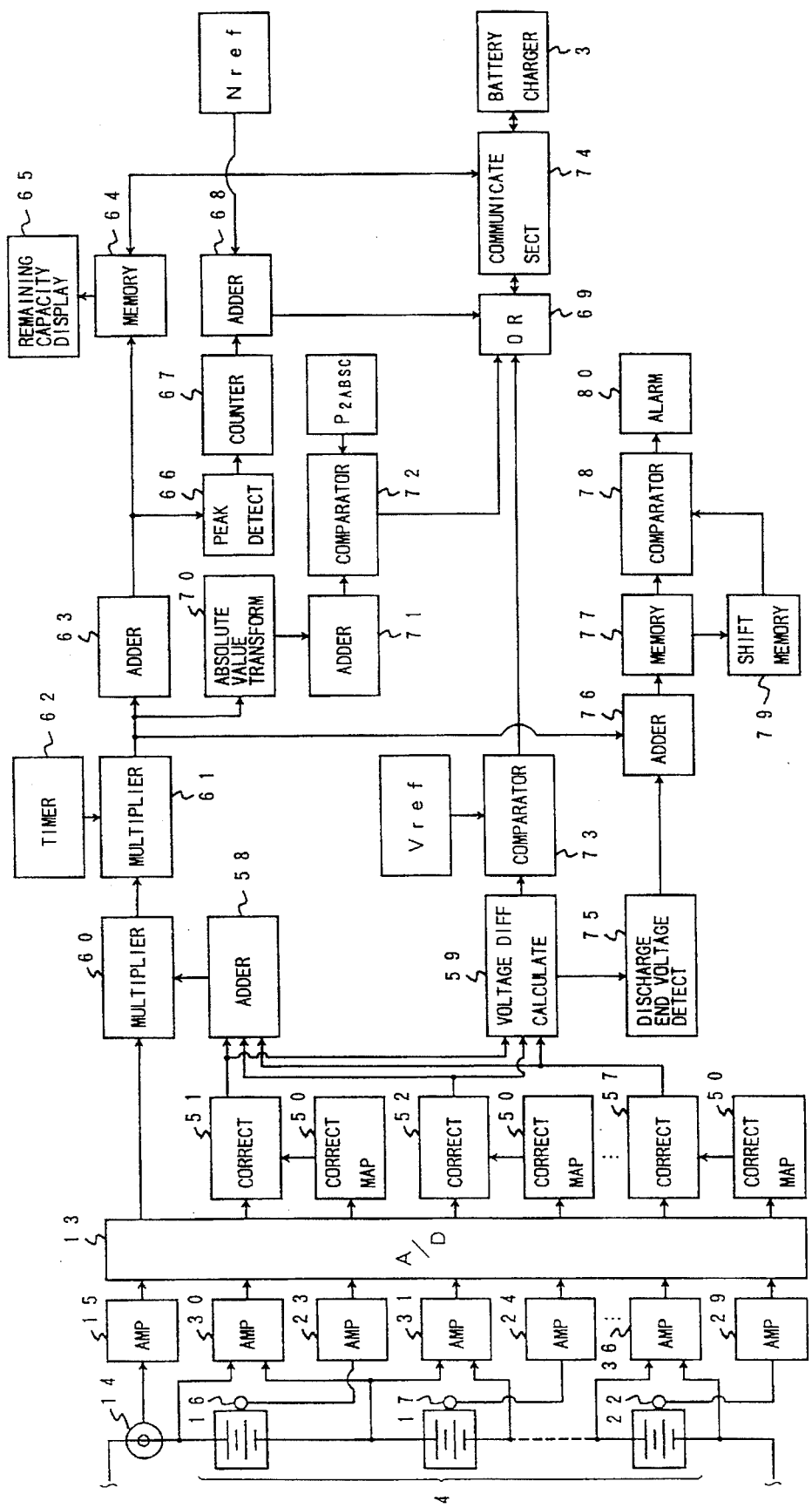
FIG. 3 is a functional block diagram showing the traction battery management system according to the present invention.

The functions of the battery management system will be described hereinbelow with reference to FIG. 3.

The functions shown in FIG. 2 and executed by the microcomputer 12 in accordance with routines (program) are the equalizing charge control processing, the remaining battery capacity measurement processing, and the battery life estimating processing, all for the high voltage battery 4.

The temperatures of the respect battery blocks are detected by the seven temperature sensors 16 to 22 as the temperature signals, respectively, and further amplified by the seven amplifiers 23 to 29, respectively. These amplified temperature signals are inputted to seven temperature-corrected value setting sections 51, respectively. The temperature-corrected value setting section 51 obtain the respective temperature correct values on the basis of temperature correct maps 50 previously stored therein, respectively. Further, the seven corrected temperatures are outputted to the seven temperature correct sections 51 to 57, respectively.

On the other hand, the seven voltages of the respect blocks are detested by the seven voltage amplifiers 16 to 22 as the voltage signals, respectively. These amplified voltage signals are inputted to the correct value setting sections 51 to 57, respectively. The seven temperature-corrected voltages are inputted to the A/D converter 13.

The respective voltage values of the respective blocks are inputted to an adder 58 and a voltage difference calculate section 59. The adder 58 adds the seven respective voltages of the respective blocks to obtain a voltage V of the high voltage battery 4. The voltage difference calculate section 59 detects the maximum voltage and the minimum voltage and further calculates a difference between the maximum and minimum voltage ($V_{max} - V_{min}$).

On the other hand, a signal detected by the current sensor 14 and amplified by the amplifier 15 is inputted to a multiplier 60 via an A/D converter 13. The multiplier 60 multiplies the current value A by the voltage V obtained by the adder 58 to obtain a power $P_1 = A \times V$.

The power P1 calculated by the multiplier 60 is transmitted to another multiplier 61. The multiplier 61 multiplies the power $P_1$ by a sampling time $\Delta t$ measured by a timer 62 to obtain a watt-hour (energy) $P_2 = P_1 \times \Delta t$.

The obtained watt-hour $P_2$ is given to another adder 63 to obtain a sum total of $P_{2S(n)}$ ($=\Sigma P_2$). The sum total watt-hour is stored in a memory section 64. This stored sum total watt-hour is displayed on a display unit 65 as a remaining battery capacity at a predetermined rate (e.g., %) (the remaining battery capacity meter section). In the above description, since the power $P_1$ and the watt-hour $P_2$ are both detected irrespective of battery discharge or charge. That is, when the traction battery is charged, these values are positive but when discharged, these values are negative.

Further, $P_{2S(n)}$ calculated by the adder 63 is inputted to a peak detect section 66. The peak detect section 66 compares the current watt-hour $P_{2S(n)}$ with the preceding value $P_{2S(n-1)}$, to obtain a difference $\Delta P_{2S(n)}$ between the two $P_{2S(n)}$ and $P_{2S(n-1)}$, and further checks whether the obtained difference $\Delta P_{2S(n)}$ is positive or negative. When this difference $\Delta P_{2S(n)}$ changes from positive (charged) to negative (discharged), a peak of the battery capacity can be detected. In the case of the watt-hour (battery capacity) peak, a counter 67 counts this peak. The number of times of this watt-hour peak corresponds to the number of times of battery charges. A comparator 68 compares the numerical value $N_c$ indicative of the number of charge times counted by the counter 67 with a reference charge times $N_{ref}$ (e.g., 10 times) previously set. If $N_c$ is more than $N_{ref}$, an equalizing charge command is outputted to an equalizing charge output section 69 (the first equalizing charge command generate section). In other words, the first equalizing charge command section is so constructed as to output an equalizing charge command when the number of times of the ordinary charges is more than the reference charge times $N_{ref}$, after the preceding equalizing charge of the traction battery.

Further, the watt-hour $P_2$ calculated by the multiplier 61 is inputted to an absolute value transform section 70 to obtain an absolute value $P_{2AB}$ ($=|P_2|$) of the watt-hour $P_2$ having a positive sign [+] when charged but [−] when discharged.

The absolute value $P_{2AB}$ is inputted to an adder 71 to obtain a sum total $P_{2ABS}$ of $P_{2AB}$ as both the discharge and charge energy. The obtained sum total watt-hour (energy) $P_{2ABS}$ is compared with a reference total watt-hour $P_{2ABSC}$ by a comparator 72. When the obtained sum total watt-hour $P_{2ABS}$ is more than the reference total watt-hour $P_{2ABSC}$, the comparator 72 outputs an equalizing charge command to the equalizing charge output section 69 (the second equalizing charge command generate section). In other words, the second equalizing charge command section is so constructed as to output an equalizing charge command when the discharge and charge energy $P_{2ABS}$ is more than the reference energy $P_{2ABSC}$, after the preceding equalizing charge of the traction battery.

In this embodiment, the reference total watt-hour $P_{2ABSC}$ is set to a value about ten times higher than the rated watt-hour of the high voltage battery 4. In this embodiment, since the rated watt-hour of the high voltage battery 4 is 30 kWh (=90 Ah (in rated capacity)×336 V (in rated voltage), when set to 20 times larger than the rated watt-hour, 30 kWh×20 (times)=600 kWh is set as the reference total watt-hour $P_{2ABSC}$. The value of 20 times is determined under consideration of both the inputted charged watt-hour and the outputted discharged watt-hour. In other words, when the sum total watt-hour during both the charged and discharged to and from the high voltage battery 4 is more than the reference total watt-hour $P_{2ABSC}$, the second equalizing charge command section outputs an equalizing charge command, after the preceding equalizing charge of the traction battery.

Further, without being limited only thereto, it is also possible to construct the second equalizing charge command generate section in such a way that only the charged watt-hour values (charged energy) are added and the equalizing charge command is outputted when the sum total of the charged watt-hour values is lager than the previously determined reference total watt-hour (e.g., 10 times larger than the rated watt-hour of the high voltage battery 4). In this case, although the absolute value transform section can be eliminated, it is necessary to provide such a function as to discriminate whether the traction battery is being charged or discharged. In this case, the watt-hour $P_2$ (having [−] sign) is omitted and only the watt-hour $P_2$ (having [+] sign) is added as the watt-hour.

On the other hand, the difference between the maximum voltage $V_{max}$ and the minimum $V_{min}$ calculated by the voltage difference calculate section 59 is compared with a reference voltage difference $V_{ref}$ by a comparator 73. When the difference $(V_{max}-V_{min})$ is higher than the reference voltage difference $V_{ref}$, the equalizing charge output section 69 outputs an equalizing charge command (the third equalizing charge command section). In this embodiment, the reference voltage difference $V_{ref}$ is determined as 1 V. In other words, when the difference between the maximum terminal voltage $V_{max}$ and the minimum terminal voltage $V_{min}$ is more than the reference voltage difference $V_{ref}$, the third equalizing charge command section outputs an equalizing charge command, after the preceding equalizing charge of the traction battery.

In summary, when the ordinary charges are repeated, since a difference in terminal voltage between the sufficiently charged battery block and the insufficiently charged battery block increases gradually, the necessity of equalizing charge is decided on the basis of this terminal voltage difference among the divided blocks.

Whenever the equalizing charge command is outputted from any one of the first, second and third equalizing charge command generating sections, the equalizing charge output section 69 outputs an equalizing charge command signal to a communication section 74 so that the high voltage battery 4 can be equalizing charged continuously after the ordinary charge has been completed.

In response to the equalizing charge command given by the equalizing charge output section 69, the communication section 74 sets some parameters (charging voltage, current, time) required for the equalizing charge, and further corrects these set parameters. The corrected parameters are outputted to a battery charger 3 as charge signals.

Further, whenever the equalizing charge signals are inputted from the equalizing charge output section 69 to the communication section 74, after the high voltage battery 4 has been charged, the remaining battery capacity stored in the memory section 64 is reset to 100% (reset function of the remaining battery capacity meter section).

Further, the minimum voltage $V_{min}$ calculated by the voltage difference calculate section 59 is inputted to a discharge end voltage detect section 75. The inputted minimum voltage $V_{min}$ is discriminated as to whether the minimum terminal voltage $V_{min}$ is the discharge end voltage (before charged) or not. If the inputted minimum voltage $V_{min}$ is the discharge end voltage before charged, the adder 76 adds the watt-hour $P_2$ so far discharged to obtain the sum total discharged watt-hour (energy) of $P_{2S(n)}$ ($=\Sigma P_2$). The obtained sum total discharged energy $P_{2S(n)}$ is stored in a memory section 77. The added value $P_{2S(n)}$ is data $P_{j(n)}$ indicative of the watt-hour (energy) discharged from when charged to when discharged to the discharge end voltage. Each of these added data is stored being shifted one by one by a shift memory 79. Further, a difference between the oldest data $P_{j(o)}$ (the initially measured data after a new traction battery has been mounted on the vehicle) and the latest (the current) data $P_{j(n)}$ is calculated and further compared with a reference battery energy value $P_{jref}$ by a comparator 78. When the difference between $P_{j(o)}$ and $P_{j(n)}$ reaches the predetermined reference battery energy value $P_{jref}$, since this indicates that the discharged energy when the traction battery is new is fairly reduced and thereby the battery reaches a life, an alarm lamp 80 is turned on or blinked (the battery life estimate function).

Figure 4:
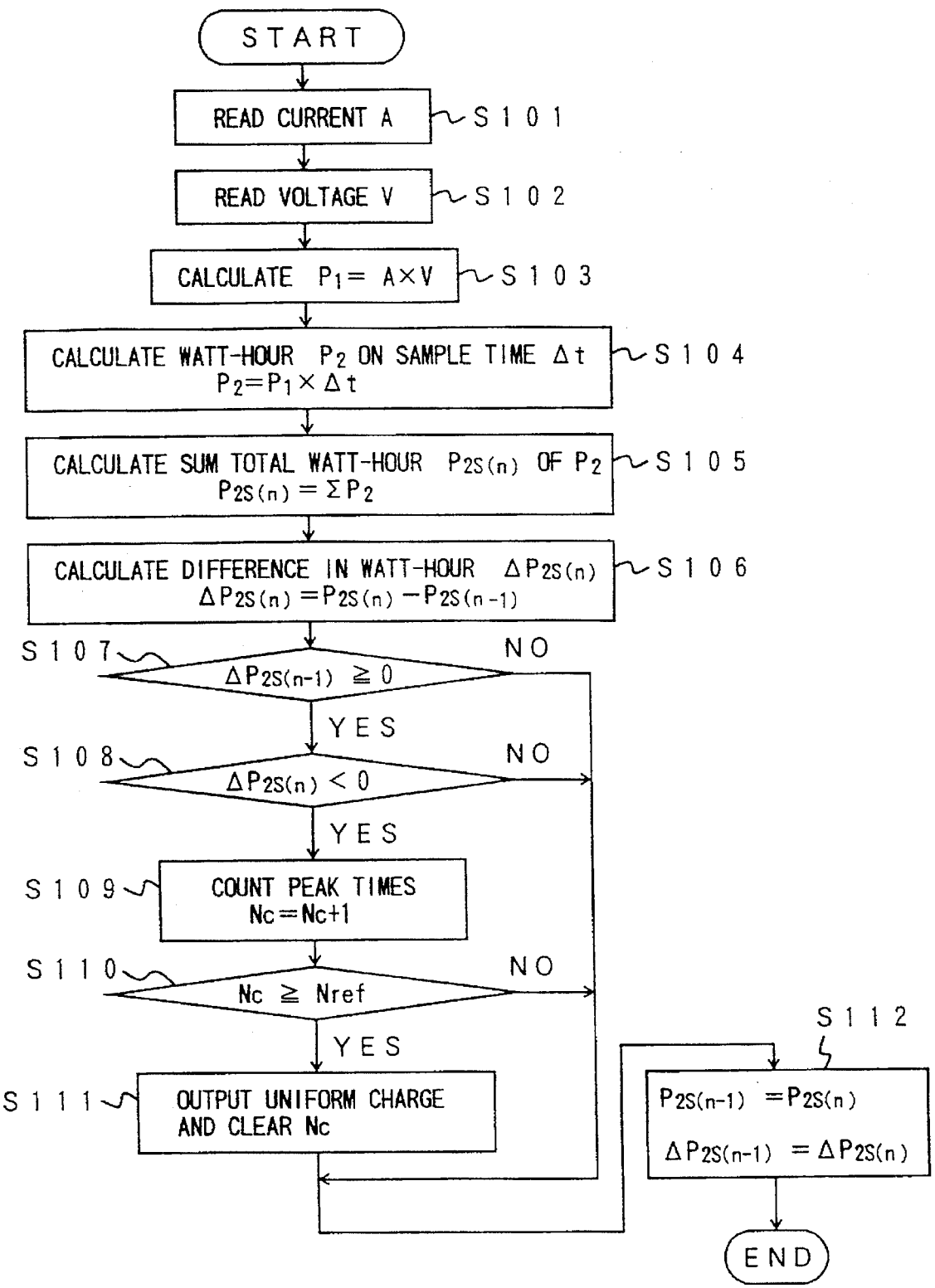
FIG. 4 is a flowchart for assistance in explaining the first equalizing charge command generating method on the basis of the number of times of battery charges according to the present invention.

With reference to a flowchart shown in FIG. 4, the operation of the first equalizing charge command generating section will be described hereinbelow. This program is executed at predetermined time intervals.

After the program starts, in step S101, the microcomputer 12 (referred as control hereinafter, simply) reads a current value A. Further, in step S102, control reads the terminal voltage values corrected by the detected terminal temperatures, respectively for each battery block for constituting the high voltage battery 4. Further, control adds the read voltage values as a total battery terminal voltage value V (the processing by the adder 58 in FIG. 3). In step S103, control multiplies the current value A and the total battery terminal voltage value V to calculate a power $P_1$ (=A×V) (the processing by the multiplier 60 in FIG. 3).

Successively, in step S104, control calculates the watt-hour (energy) $P_2$ (=$P_1 \times \Delta t$) on the basis of the data sampling time $\Delta t$ (the processing by the multiplier 61), irrespective of discharge or charge. Further, in step S105, control calculates a sum total value $P_{2S(n)}$ (=$\Sigma P_2$) of the watt-hour $P_2$ (the processing by the adder 63).

In step S106, control calculates a difference $\Delta P_{2S(n)}$ (=$P_{2S(n)}-P_{2S(n-1)}$) in watt-hour between the sum total value $P_{2S(n)}$ of the current watt-hour $P_2$ and the sum total value $P_{2S(n-1)}$ of the preceding watt-hour $P_2$. Under the battery charge condition, the watt-hour difference $\Delta P_{2S(n)}$ is more than zero (positive); and under the battery discharge condition, the watt-hour difference $\Delta P_{2S(n)}$ is less than zero (negative).

Further, in step S107, control checks whether the preceding watt-hour difference $\Delta P_{2S(n-1)}$ is equal to or more than zero ($\Delta P_{2S(n-1)} \geq 0$), that is, in the battery charge condition. If yes ($\Delta P_{2S(n-1)} \geq 0$), control proceeds to step S108. If no ($\Delta P_{2S(n-1)}<0$), control jumps to step S112.

In step S108, control checks whether the current watt-hour difference $\Delta P_{2S(n)}$ is smaller than zero ($\Delta P_{2S(n)}<0$), that is, in the battery discharge condition. If yes ($\Delta P_{2S(n)}<0$), control proceeds to step S109. If no ($\Delta P_{2S(n-1)} \geq 0$), control jumps to step S112.

In summary, in steps S107 and S108, control checks a peak obtained from the charge condition to the discharge condition. If the detected peak from the charge condition to the discharge condition is detected, control proceeds to step S109, and when the charge or discharge condition continues, control jumps to step S112 (the processing by the peak detect section 66).

In step S109, control counts up the number $N_c$ (=$N_c$+1) of the peaks (the processing by the counter 67).

Further, in step S110, control checks whether the number $N_c$ of the peaks is equal to or more than a reference charge peak time value $N_{ref}$ ($N_c \geq N_{ref}$). If yes, control proceeds to step S111 to output an equalizing charge command and further clear the reference peak time value $N_c$. Further, if no in step S110, control proceeds to step S112 (the processing by the comparator 68).

When control proceeds to step S112 from steps S107, S108, S110 and S111, control replaces the sum total value $P_{2S(n)}$ of the current watt-hour $P_2$ with the sum total value $P_{2S(n-1)}$ of the preceding watt-hour $P_2$, and further replaces the current watt-hour difference $\Delta P_{2S(n)}$ with the preceding watt-hour $\Delta P_{2S(n-1)}$, ending the program.

As described above, since the first equalizing charge command generating section outputs the equalizing charge command according to the number of charge times automatically after the equalizing charge, it is possible to simplify the maintenance of the electric vehicle.

Figure 5:
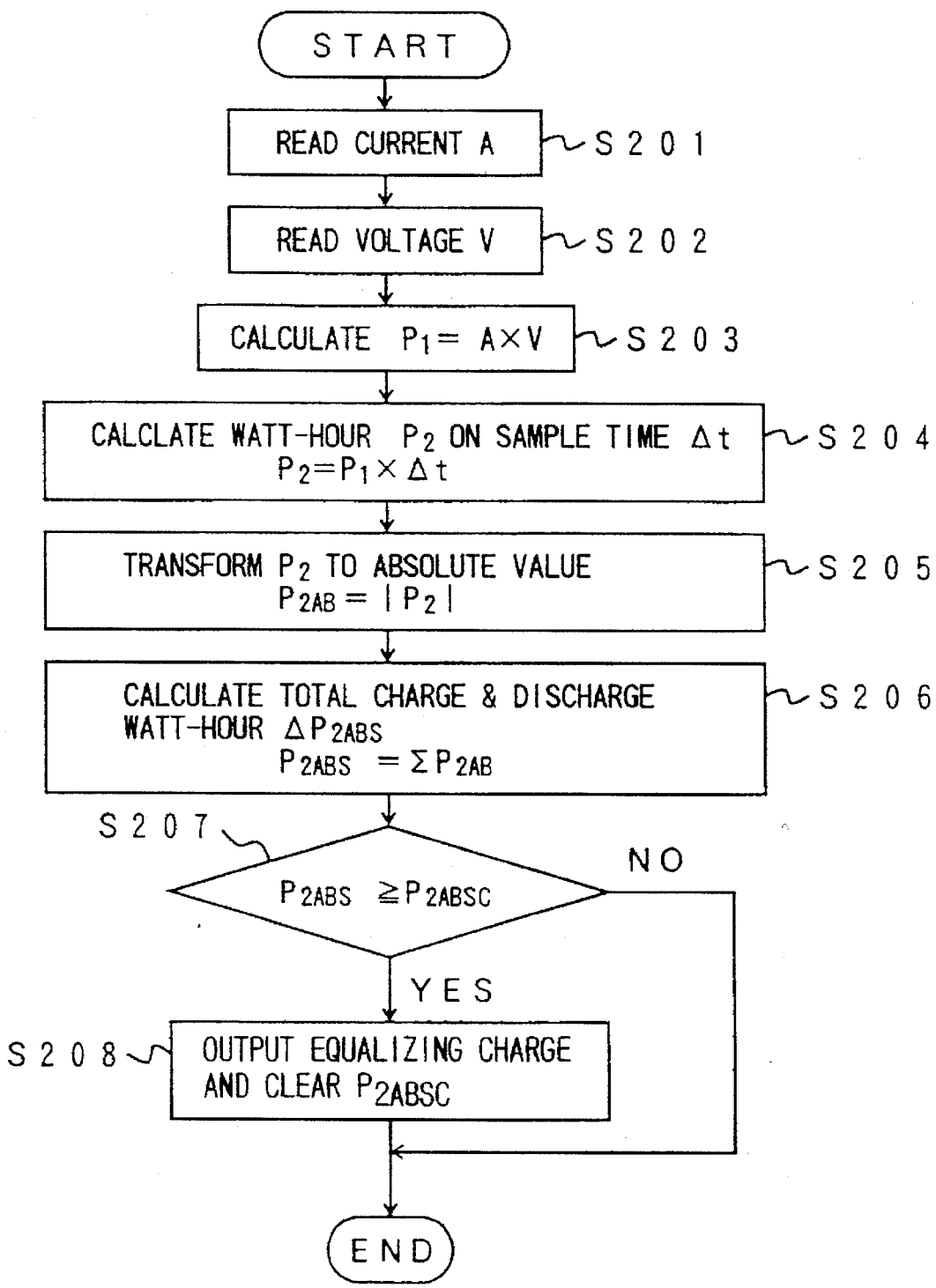
FIG. 5 is a flowchart for assistance in explaining the second equalizing charge command generating method on the basis of the charged and discharged energy of the traction battery according to the present invention.

With reference to a flowchart shown in FIG. 5, the operation of the second equalizing charge command section will be described hereinbelow. This program is executed at predetermined time intervals.

After the program starts, in step S201, control reads a current value A. Further, in step S202, control reads the terminal voltage values corrected by the detected terminal temperatures, respectively for each battery block for constituting the high voltage battery 4. Further, control adds the read voltage values as a total battery terminal voltage value V (the processing by the adder 58 in FIG. 3). In step S203, control multiplies the current value A and the total battery terminal voltage value V to calculate a power $P_1$ (=A×V) (the processing by the multiplier 60 in FIG. 3).

Successively, in step S204, control calculates the watt-hour (energy) $P_2$ (=$P_1 \times \Delta t$) on the basis of the data sampling time $\Delta t$ (the processing by the multiplier 61). Further, in step S205, control obtains the absolute value $P_{2AB}$ (=|$P_2$|) of the watt-hour $P_2$ having both a sign [+] attached when charged and a sign [−] attached when discharged (the processing by the absolute value transform section 70).

Further, in step S206, control calculates the sum total of the watt-hour (energy) both during the battery charge and discharge, that is, the sum total value $P_{2ABS}$ (=$\Sigma P_{2AB}$) of the absolute value of the watt-hour $P_2$ (the processing by the adder 71).

Further, in step S207, control checks whether the sum total value $P_{2ABS}$ is equal to or more than a reference sum total watt-hour $P_{2ABC}$ during both charge and discharge. If yes ($P_{2ABS} \geq P_{2ABSC}$), control proceeds to step S208. In step S208, control outputs the equalizing charge command and clears the $P_{2ABC}$, ending the program. Further, if no ($P_{2ABS} < P_{2ABSC}$), control ends the program (the processing by the comparator 72).

As described above, since the second equalizing charge command generate section outputs the equalizing charge command on the basis of the charge and discharge watt-hour (energy) of the traction battery, in addition to the number of charge times of the traction battery automatically, it is possible to equalizing charge the battery more securely.

Figure 6:
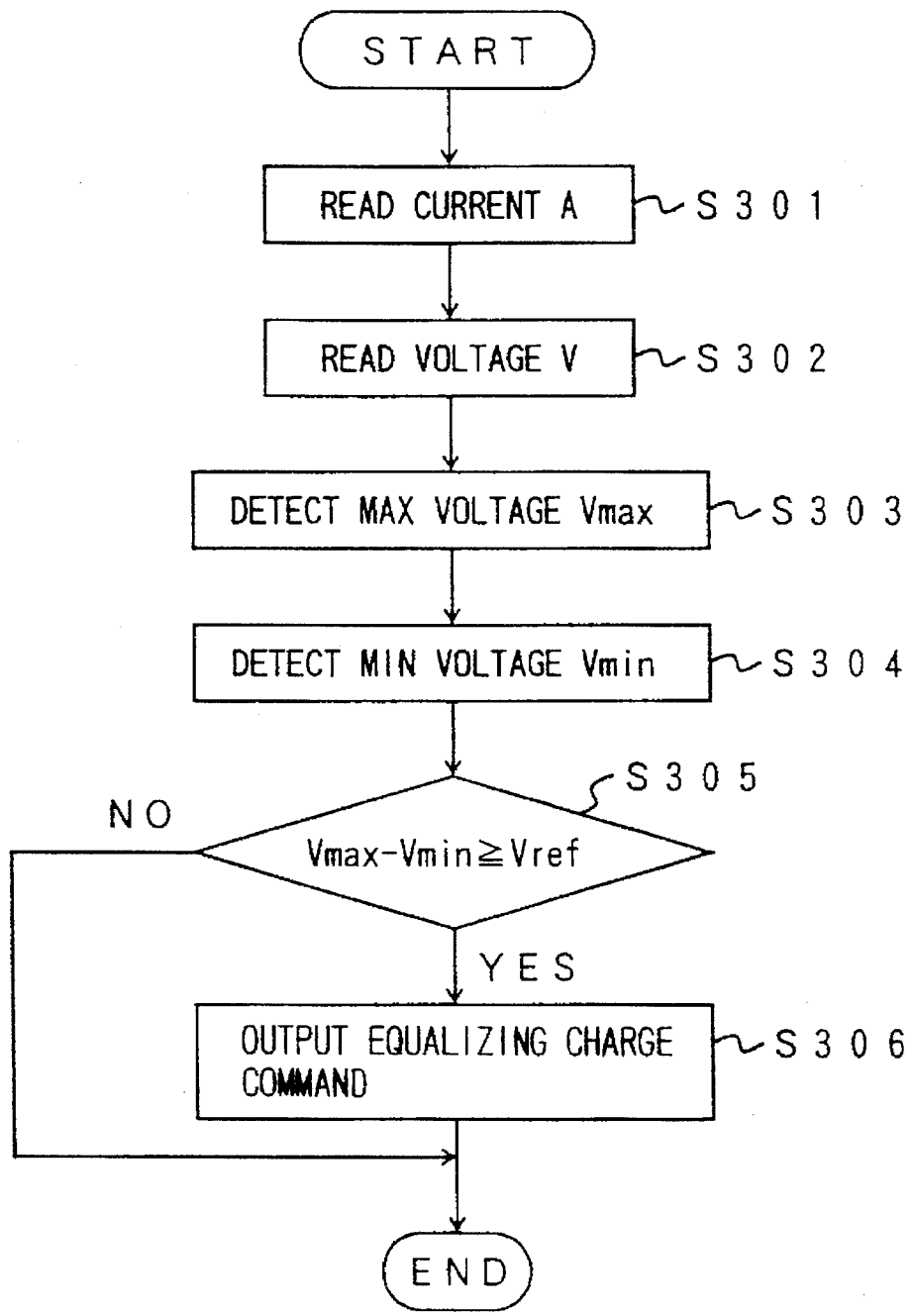
FIG. 6 is a flowchart for assistance in explaining the third equalizing charge command generating method on the basis of difference in terminal voltage among the battery blocks according to the present invention.

In the above-mentioned program, it is also possible to output the equalizing charge command on the basis of only the charge watt-hour (energy) of the traction battery, With reference to a flowchart shown in FIG. 6, the operation of the third equalizing charge command section will be described hereinbelow. This program is executed at predetermined time intervals.

After the program starts, in step S301, control reads a current value A. Further, in step S302, control reads the terminal voltage values corrected by the detected terminal temperatures, respectively for each battery block for constituting the high voltage battery 4, proceeding to step S303.

Here, the voltage values V read in step S302 are terminal voltages of the blocks, respectively. Therefore, in step S303, control calculates the maximum voltage $V_{max}$ from among the terminal voltages of the respective blocks. In step 304, control calculates the minimum voltage $V_{min}$ from among the same terminal voltages, proceeding to step S305 (the processing of the voltage processing section 59).

In Step S305, control checks whether the difference ($V_{max}-V_{min}$) between the maximum terminal voltage $V_{max}$ and the terminal minimum voltage $V_{min}$ (the processed results of the voltage processing section 59) is equal to or higher than the reference voltage difference $V_{ref}$. If the difference ($V_{max}-V_{min}$) between the maximum voltage $V_{max}$ and the minimum voltage $V_{min}$ is higher than the reference voltage difference $V_{ref}$ ($V_{max}-V_{min} \geq V_{ref}$), since this indicates that the difference in terminal voltage between the sufficiently charged battery block and the insufficiently charged battery block is large, control decides that the traction battery must be equalizing charged to eliminate the voltage difference among the battery blocks, proceeding to step S306. In step S306, control outputs the equalizing charge command. Further, if the difference ($V_{max}-V_{min}$) is higher than the reference voltage difference $V_{ref}$ ($V_{max}-V_{min} < V_{ref}$), control ends the program (the processing by the comparator 73).

As described above, since the third equalizing charge command generate section outputs the equalizing charge command on the basis of the difference in terminal voltage among the respective battery blocks, it is possible to charge traction battery more appropriately and automatically.

With reference to a flowchart shown in FIG. 7, the control operation of the communication section 74 will be described hereinbelow. This program is executed at predetermined time intervals.

After the program starts, in step S401, control checks whether the battery charger 3 is connected to an external charging power source. If connected, control proceeds to step S402. If not connected, control ends the program.

In step S402, control checks whether the equalizing charge output section 69 outputting an equalizing charge command or not. If the equalizing charge signal is being outputted, control proceeds to step S403. If not outputted, control proceeds to step S404.

In step S403, control reads a previously determined equalizing charge pattern indicative of charge voltage, current and time required for the equalizing charge, proceeding to step S405. On the other hand, in step S404, control reads a previously determined ordinary-charge pattern indicative of charge voltage, current and time required for the ordinary charge, proceeding to step S405.

Figure 7:
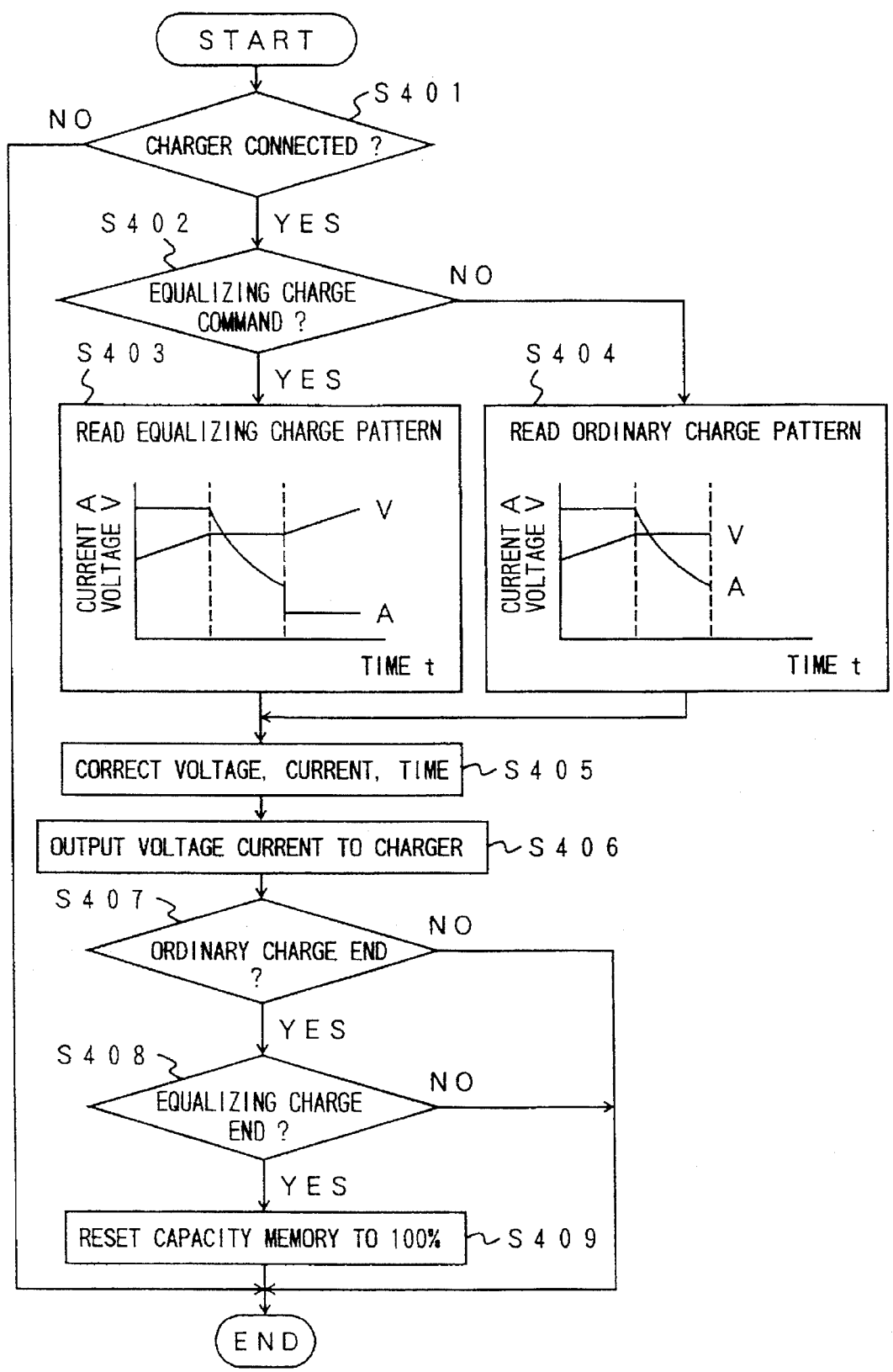
FIG. 7 is a flowchart for assistance in explaining the resetting method of the remaining battery capacity meter according to the present invention.

As shown in FIG. 7, the equalizing charge pattern set in step S403 is different from the ordinary charge pattern in that the traction battery is additionally charged at a relatively low current (4.5 to 1 A and 0.05 C or less) for a relatively long time, continuously after the ordinary charge.

In step S405, the read pattern indicative of the charge voltage, current and time is corrected on the basis of the detected temperature and various data obtained when the traction battery was discharged. For instance, after the traction battery has been discharged at a relatively large current, the current is increased and the charge time is decreased- On the other hands, after the traction battery has been discharged at a relatively small current, the current is decreased and the charge time is increased. Further, when the temperature is high, the current is decreased; and when low, the current is increased.

Further, in step S406, control outputs the corrected charge pattern indicative of the voltage, current and time to the charger 3 whenever the traction battery is charged, proceeding to step S407.

In step S407, control checks whether the ordinary charge ends. If the ordinary charge does not end, control ends the program. On the other hand, if the ordinary charge ends, control proceeds to step S408. In step S408, control checks whether the equalizing charge ends. If the equalizing charge does not end, control ends the program. On the other hand, if the ordinary charge ends, control proceeds to step S409. In step S409, control resets the remaining capacity meter memory (the memory section 64) as 100%, ending the program.

As described above, whenever the traction battery has been equalizing charged, it is possible to eliminate the error so far accumulated whenever the remaining battery capacity is obtained, by resetting the remaining battery capacity meter.

Figure 8:
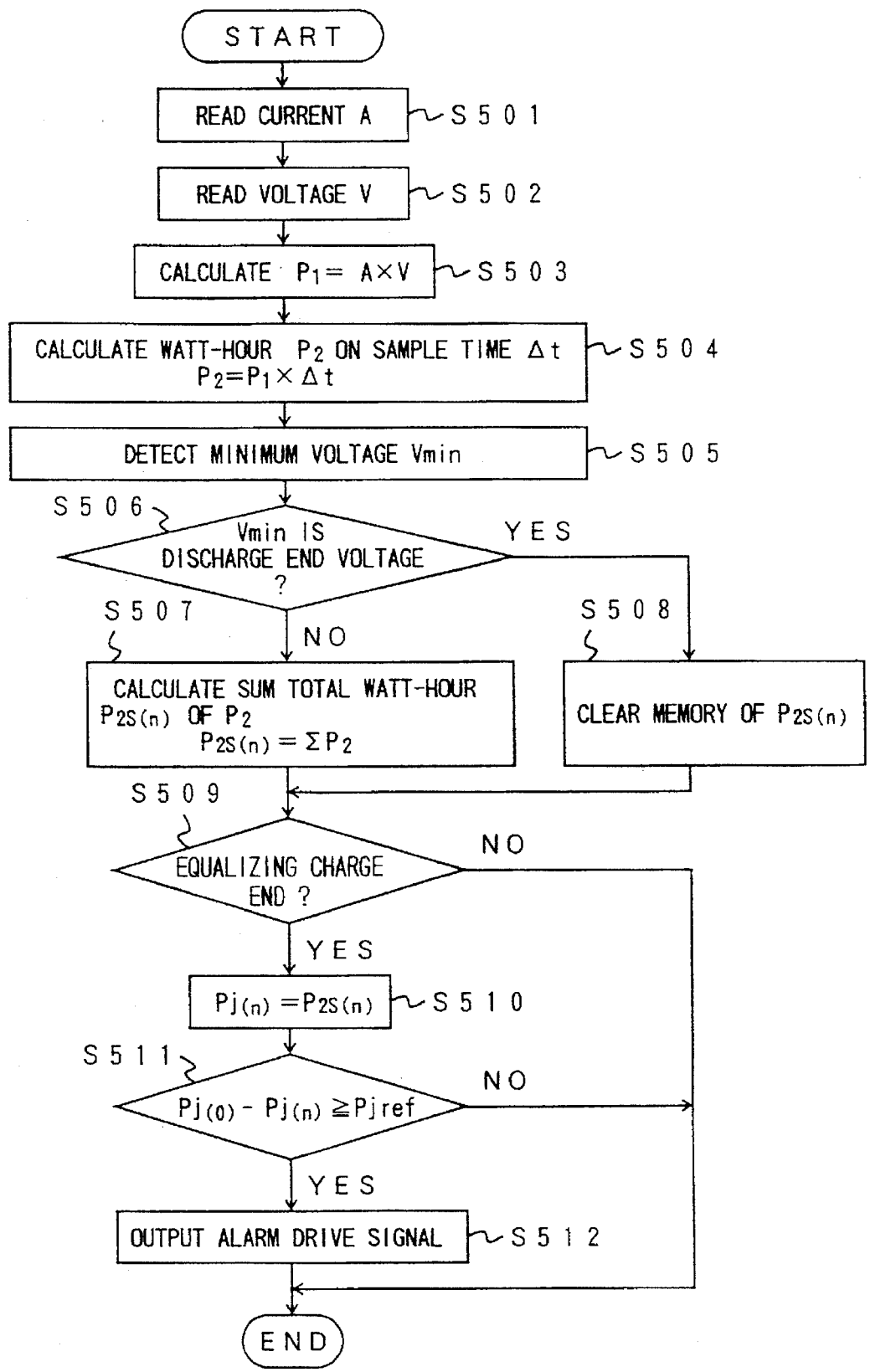
FIG. 8 is a flowchart for assistance in explaining the battery life estimating method according to the present invention.

With reference to a flowchart shown in FIG. 8, the control of the battery life estimate processing will be described hereinbelow. This program is executed at determined time intervals.

After the program starts, in step S501, control reads a current value A. Further, in step S502, control reads the terminal voltage values corrected by the detected terminal temperatures, respectively for each battery block for constituting the high voltage battery 4. Further, control adds the read voltage values as a total battery terminal voltage value V (the processing by the adder 58 in FIG. 3). In step S503, control multiplies the current value A and the added battery terminal voltage value V to calculate a power $P_1$ (=A×V) (the processing by the multiplier 60 in FIG. 3).

Successively, in step S504, control calculates the watt-hour (energy) $P_2$ (=$P_1 \times \Delta t$) on the basis of the data sampling time $\Delta t$ (the processing by the multiplier 61), proceeding to step S505. Further, in step S505, control calculates the minimum terminal voltage $V_{min}$ from among the temperature-corrected terminal voltages of the respective blocks for constituting the high voltage battery 4 (already read in step S502) (the processing by the voltage processing section 59).

In step S506, control checks whether the minimum voltage $V_{min}$ detected in step S505 reaches a discharge end voltage (the processing by the discharge end voltage detect section 75). If no, control proceeds to step S507 to calculate the sum total value $P_{2S(n)}$(=$\Sigma P_2$) of the watt-hour $P_2$ from when the traction battery is first discharged to when the minimum terminal voltage $V_{min}$ reaches the discharge end voltage (which indicates the total discharged energy after the traction battery has been charged until the minimum voltage $V_{min}$ reaches the discharge end voltage) (the processing by the adder 63). In step S506, if control decides that the minimum terminal voltage $V_{min}$ reaches the discharge end voltage, control proceeds to step S508 to clear the preceding sum total value $P_{2S(n)}$(=$\Sigma P_2$) of the watt-hour $P_2$ stored in the memory, proceeding to step S509.

In step S509, control checks whether the equalizing charge ends. If does not end, control ends the program. On the other hand, if the equalizing charge ends, in step S510, control stored and shifts the result of the current sum total value $P_{2S(n)}$(=$\Sigma P_2$) in the memory as data ($P_{j(n)}$=$P_{2S(n)}$. The calculated sum total value $P_{2S(n)}$(=$\Sigma P_2$) of the watt-hour $P_2$ is stored in the memory 77 in sequence being shifted one by one as data $P_{j(n)}$, proceeding to step S509.

Further, in step S511, control checks whether the difference between the initial data $P_{j(o)}$ measured when the new traction battery has been initially mounted and the current data $P_{j(n)}$ is equal to or large than a reference power capacity $P_{jref}$.

In step S511, if the difference between $P_{j(o)}$ and $P_{j(n)}$ is equal to or larger than the reference power capacity $P_{jref}$ as ($P_{j(o)}-P_{j(n)} \geq P_{jref}$), since this indicates that the discharged energy is fairly reduced as compared when the traction battery was new; that is, the traction battery deteriorates, control proceeds to step S512. In step S512, control generates an alarm drive signal to turn on or blink the alarm lamp 80, ending the program.

As described above, it is possible to accurately estimate the battery life by measuring the battery deterioration by comparing the current battery conditions (current discharged energy) with the initial battery conditions (initially discharged energy).

Further, in this embodiment, the management system outputs three equalizing charge commands in such a way that the traction battery can be equalizing charged continuously after the ordinary charge, in response to any of the equalizing charge commands. Without being limited only thereto, however, it is also possible to construct the battery management system in such a way that one or two of these three equalizing charge commands can be outputted to equalizing charge the traction battery automatically.

As described above, in the traction battery management system according to the present invention, since the equalizing charge command can be generated whenever the number of times of the ordinary charges increases beyond a reference value or whenever the sum total watt-hour (charged energy or charged and discharged energy) of the traction battery increases beyond a reference value or whenever a difference in block terminal voltage between the maximum and minimum values among the battery blocks increases beyond a reference value, it is possible to equalizing charge the high voltage battery automatically after the ordinary battery charge, with the result that the maintenance of the traction battery can be facilitated.

Further, since the remaining battery capacity meter section can be reset automatically whenever the traction battery has been equalizing charged, it is possible to eliminate an accumulated error of the remaining battery capacity meter.

Further, since the battery deterioration or battery life can be detected by comparing the initial discharged energy (when the traction battery is new) with the current discharged energy (when the traction battery is now equalizing charged), it is possible to detect the traction battery deterioration or the traction battery life automatically, for traction battery replacement.

While the presently preferred embodiment of the present invention has been shown and described, it is to be understood that this disclosure is for the purpose of illustration and that various changes and modifications may be made without departing from the scope of the invention as set forth in the appended claims.

What is claimed is:

1. A traction battery management system, comprising:
    detecting means for detecting battery conditions of a traction battery composed of a plurality of batteries and mounted on an electric vehicle;

calculating means for calculating battery charge and discharge conditions of the traction battery on the basis of the detected battery conditions; and means for equalizing charging the traction battery on the basis of the calculated battery charge and discharge conditions, in such charging characteristics that charge current is relatively smaller and charge time is relatively longer, as compared with those in an ordinary battery charge, continuously after the ordinary battery charge.

2. The traction battery management system according to claim 1, wherein the detected battery conditions are current (A), terminal voltages (V) of the respective batteries, and duration time ($\Delta t$) during both battery charge and discharge of the traction battery.

3. The traction battery management system according to claim 1, wherein the calculated traction battery charge and discharge conditions are charge and discharge power ($P_1 = A \times V$), charge and discharge watt-hour ($P_2 = P_1 \times \Delta t$), sum total charge or discharge watt-hour ($P_{2(n)} = \Sigma P_2$) during charge or discharge, sum total charge and discharge watt-hour ($P_{2ABS} = \Sigma P_{2AB}$) during both charge and discharge, difference in terminal voltage between maximum and minimum values ($V_{max} - V_{min}$) among the batteries, and the number of times of the ordinary charges ($N_c$) calculated by counting peaks of watt-hours ($P_2$) of charged traction battery.

4. The traction battery management system according to claim 3, wherein said equalizing charging means charges the traction battery when the number ($N_c$) of times of the ordinary charges becomes equal to or larger than a reference value ($N_{ref}$), after the preceding equalizing charge.

5. The traction battery management system according to claim 3, wherein said equalizing charging means charges the traction battery when the sum total watt-hour ($P_{2ABS} = \Sigma P_{2AB}$) during both battery charges and discharges becomes equal to or larger than a reference watt-hour value ($\Sigma P_{2ABSC}$), after the preceding equalizing charge.

6. The traction battery management system according to claim 3, wherein said equalizing charging means charges the traction battery when the sum total watt-hours ($P_{2S(n)} = \Sigma P_2$) during only battery charges becomes equal to or larger than a reference watt-hour value, after the preceding equalizing charge.

7. The traction battery management system according to claim 3, wherein said equalizing charging means charges the traction battery when the difference ($V_{max} - V_{min}$) in terminal voltage between the maximum and minimum values among the respective batteries becomes equal to or larger than a reference difference value ($V_{ref}$).

8. The traction battery management system according to claim 1, which further comprises:

means for indicating remaining battery capacity in a ratio by subtracting discharged watt-hour from a full scale; and means for resetting the remaining battery capacity indicating means whenever the traction battery is charged by said equalizing charging means.

9. The traction battery management system according to claim 1, which further comprises battery life discriminating means, comprising:

means for calculating a sum total watt-hour ($\Sigma P_2$) from when the traction battery is discharged to when a minimum terminal voltage among the respective batteries reaches a discharge end voltage;

means storing the calculated sum total discharge watt-hour ($\Sigma P_2$) as data ($P_{j(n)}$) in a memory unit;

means for comparing the stored current data ($P_{j(n)}$) with initial data ($P_{j(o)}$) calculated when the traction battery was new whenever the traction battery is equalizing charged; and means for generating an alarm when a difference ($P_{j(o)} - P_{j(n)}$) between the initial data ($P_{j(o)}$) and the current data ($P_{j(n)}$) is equal to or larger than a reference value ($P_{jref}$).

10. The traction battery management system according to claim 2, wherein the terminal voltages of the respective batteries are corrected on the basis of detected temperatures of the respective batteries.

11. A method of equalizing charging a traction battery composed of a plurality of batteries, comprising the steps of:

detecting traction battery current (A);

detecting traction battery voltage (V);

calculating power ($P_1 = A \times V$) of the traction battery;

calculating watt-hour ($P_2 = P_1 \times \Delta t$) of the traction battery;

calculating a sum total watt-hour ($P_{2S(n)} = \Sigma P_2$) both during charge and discharge;

calculating a difference ($\Delta P_{2S(n)} = P_{2S(n)} - P_{2S(n-1)}$) in watt-hour between the sum total value ($P_{2S(n)}$) to current sampling time and the sum total value ($P_{2S(n-1)}$) to preceding sampling time;

checking whether the calculated difference ($\Delta P_{2S(n-1)}$) is zero or positive;

if yes, checking whether the calculated difference ($\Sigma P_{2S(n)}$) is negative;

if yes, counting the number of times that the calculated difference changes from positive to negative as the number of peaks ($N_c$);

comparing the counted number of peaks ($N_c$) with a reference value ($N_{ref}$); and if the counted number of peaks ($N_c$) is equal to or larger than the reference value ($N_c$), generating an equalizing charge command and clearing the counted peaks ($N_c$).

12. A method of equalizing charging a traction battery composed of a plurality of batteries, comprising the steps of:

detecting traction battery current (A);

detecting traction battery voltage (V);

calculating power ($P_1 = A \times V$) of the traction battery;

calculating watt-hour ($P_2 = P_1 \times \Delta t$) of the traction battery;

obtaining an absolute value of the calculated watt-hour ($P_{2AB} = |P_2|$);

calculating a sum total absolute watt-hour ($P_{2ABS} = \Sigma P_{2AB}$) both during charge and discharge;

comparing the calculated sum total absolute watt-hour ($P_{2ABS}$) with a reference value ($P_{2ABSC}$); and if the calculated sum total absolute watt-hour ($P_{2ABS}$) is equal to or larger than the reference value $P_{2ABSC}$), generating an equalizing charge command and clearing the calculated sum total absolute watt-hour ($P_{2ABS}$).

13. A method of equalizing charging a traction battery composed of a plurality of batteries, comprising the steps of:

detecting traction battery current (A);

detecting traction battery voltage (V);

detecting a maximum terminal voltage ($V_{max}$) among the respective batteries constituting the traction battery;

detecting a minimum terminal voltage ($V_{min}$) among the respective batteries;

comparing a difference ($V_{max} - V_{min}$) in terminal voltage between the maximum and minimum values among the respective batteries with a reference value ($V_{ref}$); and if the difference ($V_{max}-V_{min}$) is equal to or larger than the reference value ($V_{ref}$), generating an equalizing charge command.

14. The method of equalizing charging a traction battery according to claim 11, which further comprises a process of resetting a remaining battery capacity meter, having the steps of:

checking whether the traction battery is connected to a battery charger;

checking whether the equalizing charge command is being outputted;

if no, reading an ordinary charge pattern from a map indicative of current, voltage and time;

if yes, reading a equalizing charge pattern from a map indicative of current, voltage and time;

correcting the read voltage, current and time on the basis of detected temperature and preceding discharge conditions;

outputting the corrected charge voltage and charge current to the charger;

checking whether the ordinary charge ends;

if yes, checking whether the equalizing charge ends; and if yes, resetting the remaining battery capacity meter to a full scale.

15. The method of equalizing charging a traction battery according to claim 11, which further comprises a battery life estimating processing, having the steps of:

detecting traction battery current (A);

detecting traction battery voltage (V);

calculating power ($P_1 = A \times V$) of the traction battery;

calculating watt-hour ($P_2 = P_1 \times \Delta t$) of the traction battery;

detecting a minimum terminal voltage ($V_{min}$) among the respective batteries constituting the traction battery;

checking whether the detected minimum terminal voltage reaches a discharge end voltage;

if yes, calculating a sum total watt-hour ($P_{2S(n)} = \Sigma P_2$) from when the traction battery is discharged to when the minimum terminal voltage among the respective batteries reaches the discharge end voltage;

checking whether the equalizing charge ends;

if ends, storing the calculated sum total watt-hour ($P_{2S(n)} = \Sigma P_2$) during discharge as data ($P_{j(n)}$) in a memory;

comparing the stored current data ($P_{j(n)}$) with initial data ($P_{j(o)}$) when the traction battery was new; and generating an alarm when a difference ($P_{j(o)} - P_{j(n)}$) between the initial data ($P_{J(o)}$) and the current data ($P_{j(n)}$) is equal to or larger than a reference value ($P_{jref}$).

* * * * *